(12) United States Patent
Ong et al.

(10) Patent No.: US 7,599,175 B1
(45) Date of Patent: Oct. 6, 2009

(54) VIBRATION-FREE FAN MOUNTING DEVICE

(75) Inventors: Brett C. Ong, San Jose, CA (US); William A. De Meulenaere, Newark, CA (US); Barry Marshall, Santa Clara, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 80 days.

(21) Appl. No.: 11/828,870

(22) Filed: Jul. 26, 2007

(51) Int. Cl.
*G06F 1/16* (2006.01)
(52) U.S. Cl. .................. 361/679.34; 715/771; 713/170; 206/307
(58) Field of Classification Search .................. 715/771; 713/2, 170, 323; 345/589; 361/679–687, 361/724–727; 206/307
See application file for complete search history.

(56) References Cited

U.S. PATENT DOCUMENTS

| | | | | |
|---|---|---|---|---|
| 5,463,527 A | * | 10/1995 | Hager et al. | 361/685 |
| 7,034,843 B2 | * | 4/2006 | Nair et al. | 345/589 |
| 7,328,410 B2 | * | 2/2008 | King et al. | 715/771 |
| 2002/0023237 A1 | * | 2/2002 | Yamada et al. | 713/323 |

* cited by examiner

*Primary Examiner*—Hung V Duong
(74) *Attorney, Agent, or Firm*—Osha • Liang LLP

(57) ABSTRACT

A computer server system having a cooling mechanism, including a fan configured to cool the computer server system, wherein the computer server system includes a plurality of components, a first casing including the plurality of components and the fan, and a second casing including the fan, wherein the second casing includes a first bracket and a second bracket that latch together to enclose the fan, and wherein the second casing enclosing the fan is configured to provide complete isolation of the fan from the first casing.

16 Claims, 6 Drawing Sheets

VIBRATION-FREE FAN MOUNTING DEVICE

BACKGROUND

FIG. 1 shows a typical computer server rack 10 with blade servers 20 disposed therein. FIG. 2 shows a perspective view of an individual blade server 20. As can be seen in FIGS. 1 and 2, the computer servers 20 are thin, and there is very little tolerance between the individual blade servers 20 within the computer server rack 10.

Over time, as the performance of rack mounted computer systems has increased, the amount of heat generated by various computer system components has increased. This, in turn, requires enhanced cooling to maintain required operating temperatures. The most common approach to computer system cooling is the use of fans. However, with the ever-increasing power budget and space constraints of rack mounted computer systems, available cooling solutions are limited. Because space constraints restrict the physical size of fans, a common solution is the use of fans with high revolutions per minute (RPM). However, high RPM fans significantly increase the amount of vibration generated throughout the computer system.

FIG. 3 shows a conventional computer system having a cooling mechanism. As can be seen, a computer system 300 includes a computer chassis 301 and fans 302-305. Also, the computer chassis 301 has slots 307-310 for enclosing the fans 302-305. Those skilled in the art will appreciate that each slot 307-310 are different from each other in shape according to each different shape of the casing of the fan 302-305. Also, those skilled in the art will appreciate that there may be different number of fans. The fans 302-305 are disposed at one outside surface of the computer chassis 301 such that air can be efficiently moved in or out using the fans 302-305. Those skilled in the art will appreciate that the fans 302-305 may be disposed at different positions of the computer chassis 301, separately or together, as far as air can be efficiently moved in or out through the fans 302-305.

FIG. 4 shows an interior view of a conventional computer system 600 having a casing 601, fans 602-605, and hard disk drive 607. The fans 602-605 are disposed at one side wall of the casing 601. Typically, in such a computer system having cooling fans, vibration generated by fans is transferred through the support structure to other components within the computer system. In some instances, the generated vibration transferred throughout the computer system may interfere with the performance of the other components.

SUMMARY

In general, in one aspect, the invention relates to a computer server cooling system, comprising a first casing comprising a top enclosure and a bottom enclosure, and a fan disposed between the top enclosure and the bottom enclosure, wherein the fan is enclosed in a second casing configured to completely isolate the fan from the first casing such that vibration of the fan is prevented from being transferred to the first casing, and wherein the second casing comprises a first bracket and a second bracket that latch together to enclose the fan.

In general, in one aspect, the invention relates to a computer server system having a cooling mechanism, comprising a fan configured to cool the computer server system, wherein the computer server system includes a plurality of components, a first casing comprising the plurality of components and the fan, and a second casing comprising the fan, wherein the second casing comprises a first bracket and a second bracket that latch together to enclose the fan, wherein the second casing enclosing the fan is configured to provide complete isolation of the fan from the first casing.

Other aspects of the invention will be apparent from the following description and the appended claims.

DETAILED DESCRIPTION

Figure 1:
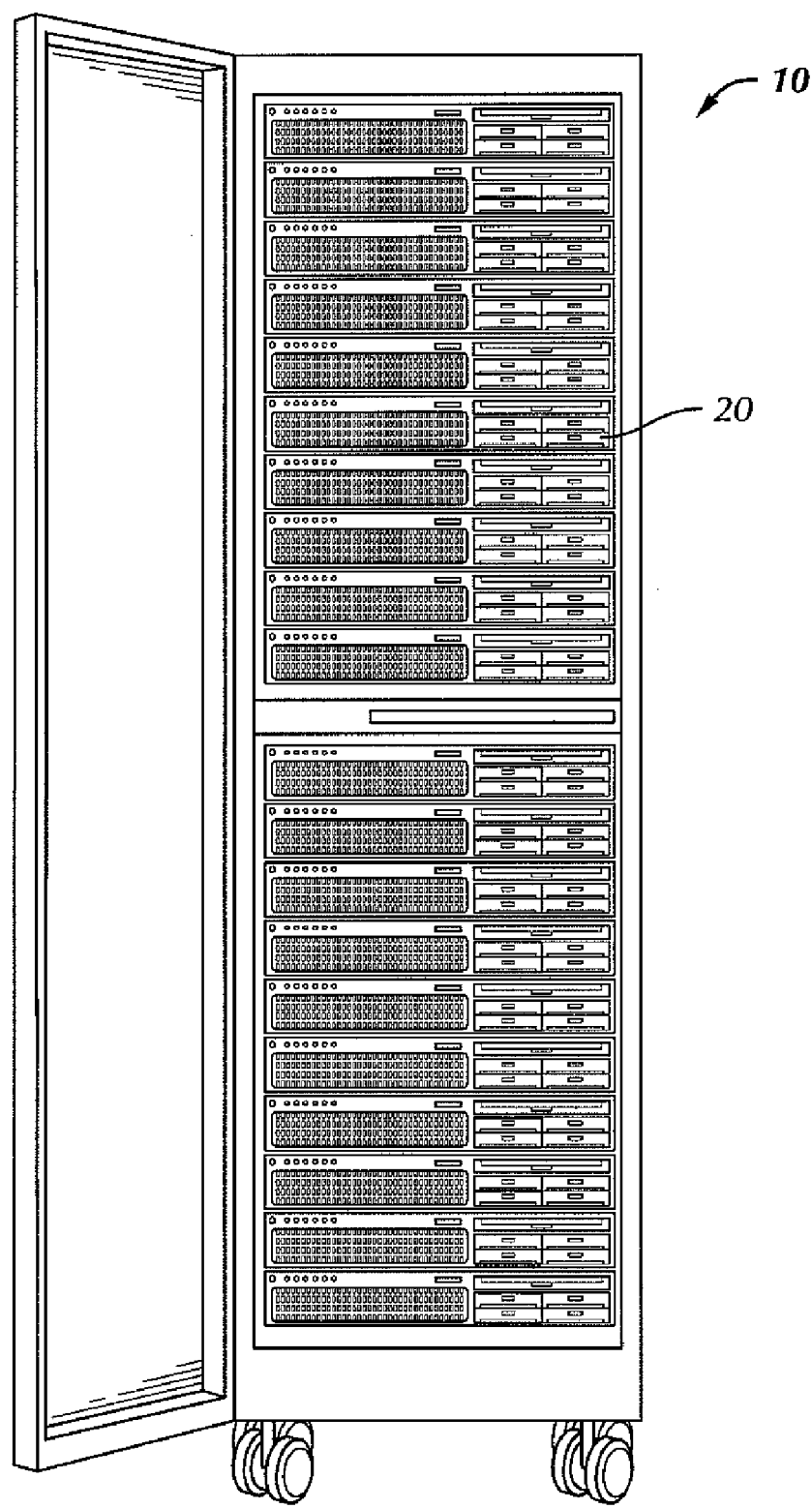
FIG. 1 shows a conventional computer server rack with computer servers.
Figure 2:
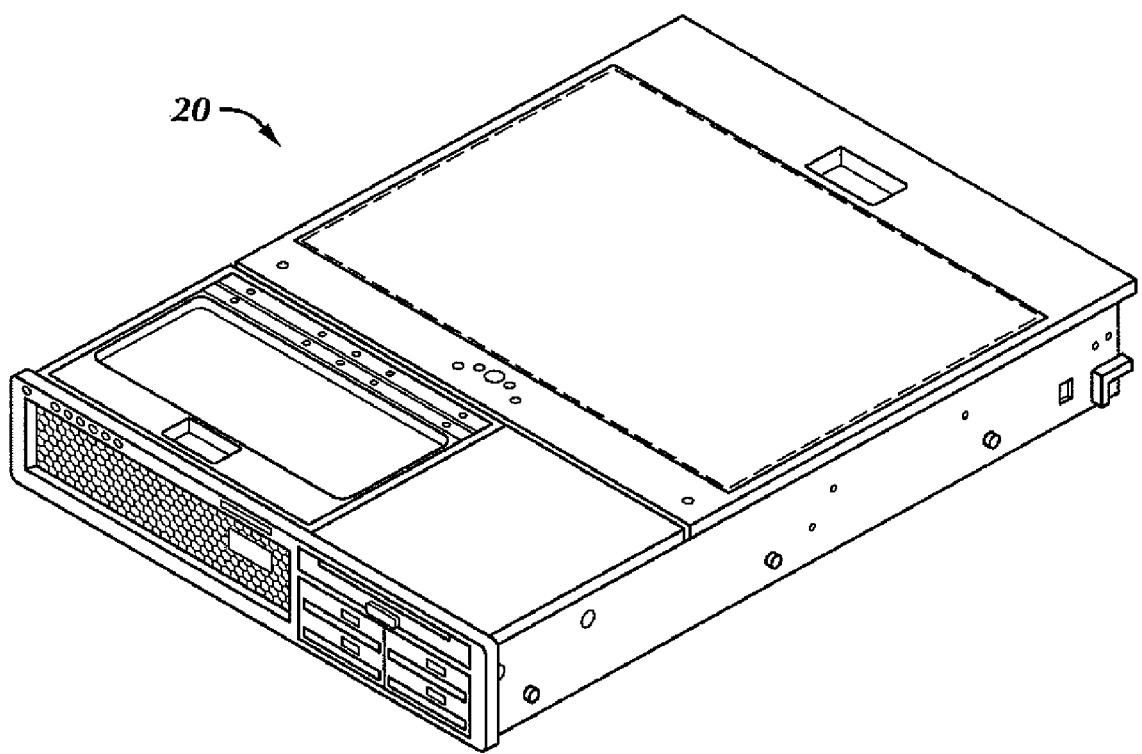
FIG. 2 shows a conventional computer server.
Figure 3:
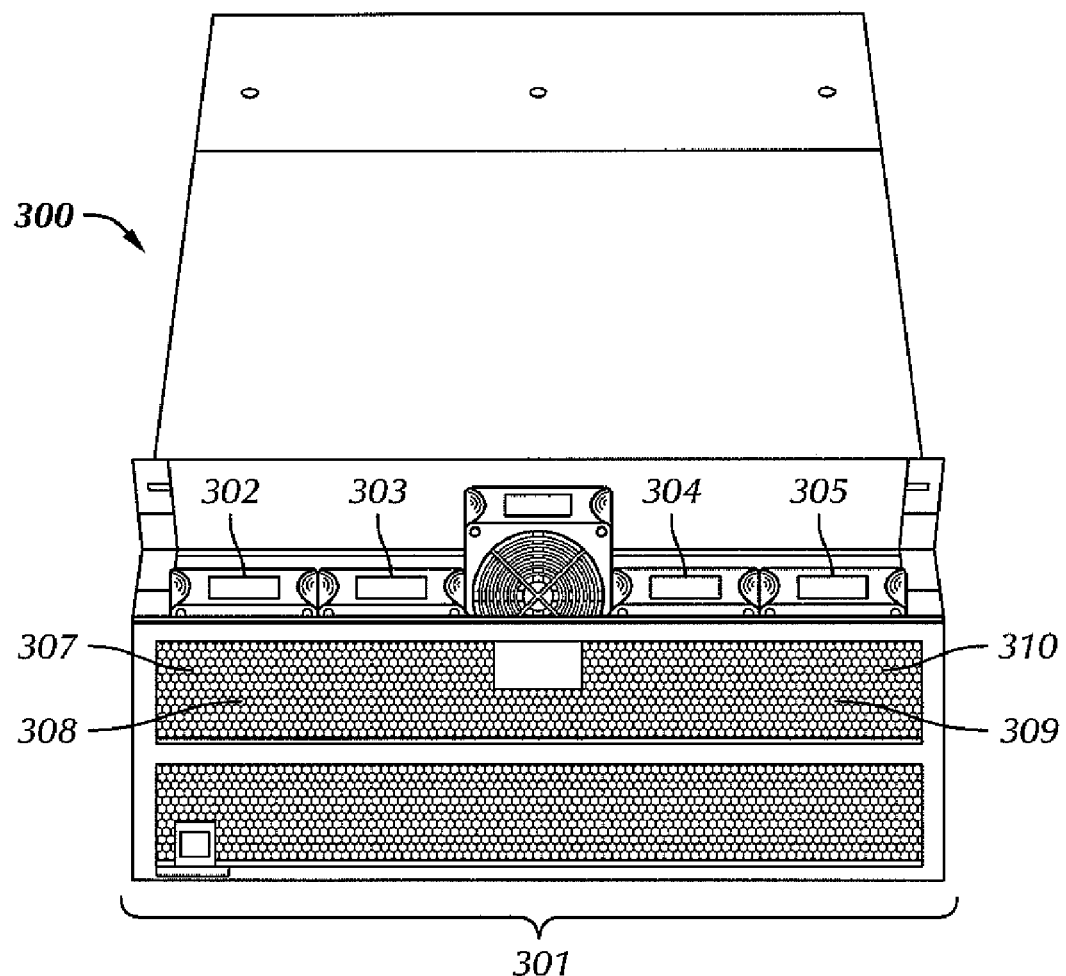
FIG. 3 shows a perspective view of a conventional computer server cooling system.
Figure 4:
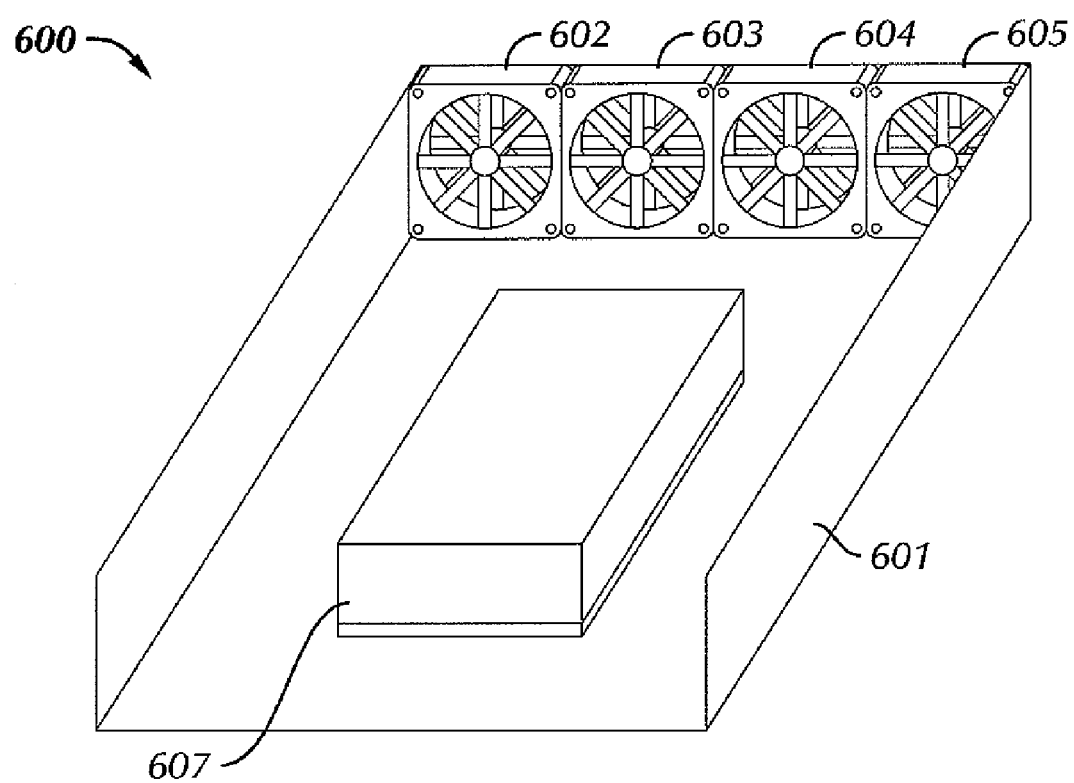
FIG. 4 shows a conventional computer system.

Specific embodiments of the invention will now be described in detail with reference to the accompanying figures. Like elements in the various figures are denoted by like reference numerals for consistency.

In the following detailed description of embodiments of the invention, numerous specific details are set forth in order to provide a more thorough understanding of the invention. However, it will be apparent to one of ordinary skill in the art that the invention may be practiced without these specific details. In other instances, well-known features have not been described in detail to avoid unnecessarily complicating the description.

In general, embodiments of the invention relate to a computer server system having a cooling mechanism with vibration isolation. Specifically, embodiments of the invention provide a vibration-free fan mounting device. More specifically, embodiments of the invention provide a bracketed casing that completely isolates a cooling fan, resulting in a vibration-free high-rpm fan cooling solution for heat-generating server systems.

Figure 5:
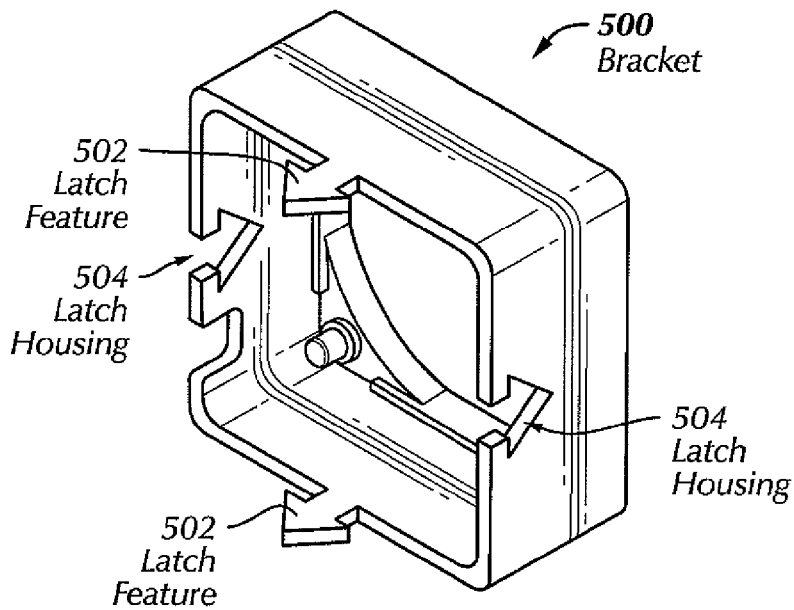
FIGS. 5-6 show vibration-free fan mounting devices in accordance with one or more embodiments of the invention.

FIG. 5 shows a portion of a vibration-free fan casing in accordance with one or more embodiments of the invention. Specifically, FIG. 5 shows a single bracket (500) of a two-piece bracket casing used to enclose a fan in accordance with one or more embodiments of the invention. The bracket (500) shown in FIG. 5 includes a latch feature (502) and a latch housing (504). In one or more embodiments of the invention, the latch feature is configured to be inserted into a latch housing on the second of the two-piece bracket casing (not shown). Similarly, the latch housing is configured to receive a latch feature from the second of the two-piece bracketed casing. In this manner, the two bracketed pieces latch together to completely enclose a fan located within the bracketed casing.

Those skilled in the art will appreciate that the second of the two-piece bracket casing may have an identical geometry at the bracket shown in FIG. 5. Thus, the second bracket also includes a latch housing and latch feature to correspond to the latch housing and the latch feature of the bracket shown in FIG. 5. This allows a single part to be manufactured and one of the first or second brackets is merely turned over in order to properly mate with the other. Additionally, those skilled in the art will appreciate that while the latch is shown as triangular, any other shape, e.g., rectangular, circular, etc., is equally applicable to the latch feature and the latch housing.

Figure 6:
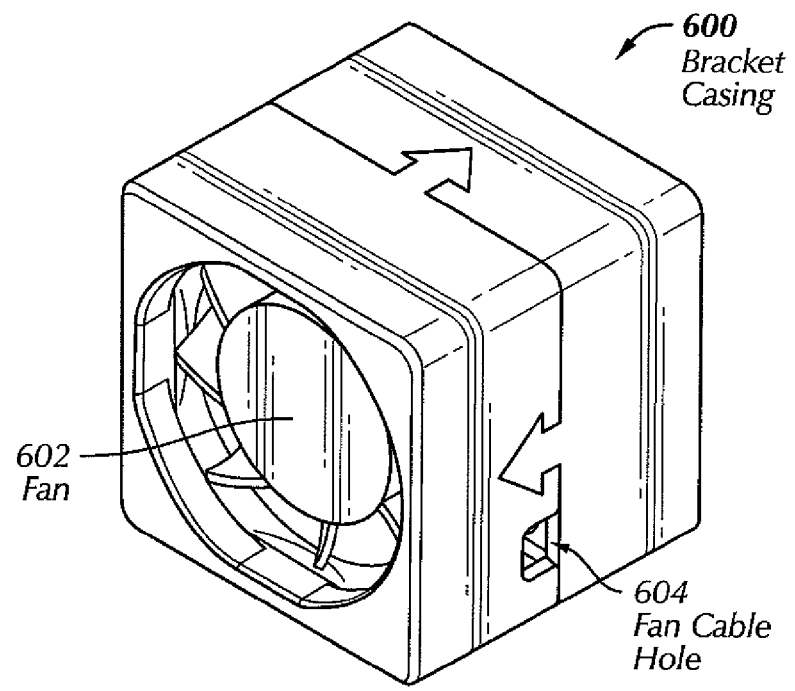

FIG. 6 shows a complete vibration-free fan casing in accordance with one or more embodiments of the invention. Specifically, FIG. 6 shows a two-piece bracket casing (600) configured to house and completely envelope a fan (602). In one or more embodiments of the invention, the fan housed within the casing (600) may be a 36 mm fan, a 40 mm fan, or any other size fan that is configured to fit inside a computer server system for purposes of cooling the computer server system. Those skilled in the art will appreciate that the two-piece bracket casing is scalable to fit any size fan. As shown in FIG. 6, the two brackets are latched together using the latch features and the latch housings located on each of the two brackets. Therefore, the only open space in the bracket casing is the fan cable hole (604). The bracket casing of FIG. 6 completely isolates the fan from other components within the computer server system. More specifically, the bracket shown in FIG. 6 is designed to eliminate all direct contact of the fan with the other components in the computer server system, such as a hard disk drive, a motherboard, etc. Thus, when the fan (602) is in operation, because the fan is isolated from the components in the computer server system enclosure, the vibration caused by the fan (602) is kept from being transferred to the enclosure and the other components of the computer server system.

In one or more embodiments of the invention, the bracket is made of rubber or a suitable energy absorbing elastomer. Further, both bracket pieces have the same exact geometry such that a single tool is required to fabricate the bracketed casing. Those skilled in the art will appreciate that any elastic materials may be used to fabricate the bracketed casing, such as natural or synthetic rubber. Further examples of elastic materials include, but are not limited to, polyisoprene, butyl rubber, polybutadiene, SBR, NBR, ABS, EPM, EPDM, silicone rubber, sorbathane, polyurethane rubber, foamed polyurethane, damping foam, fabric-rubber composite, and combinations thereof. In addition, the bracketed casing may have insulating properties.

Figure 7:
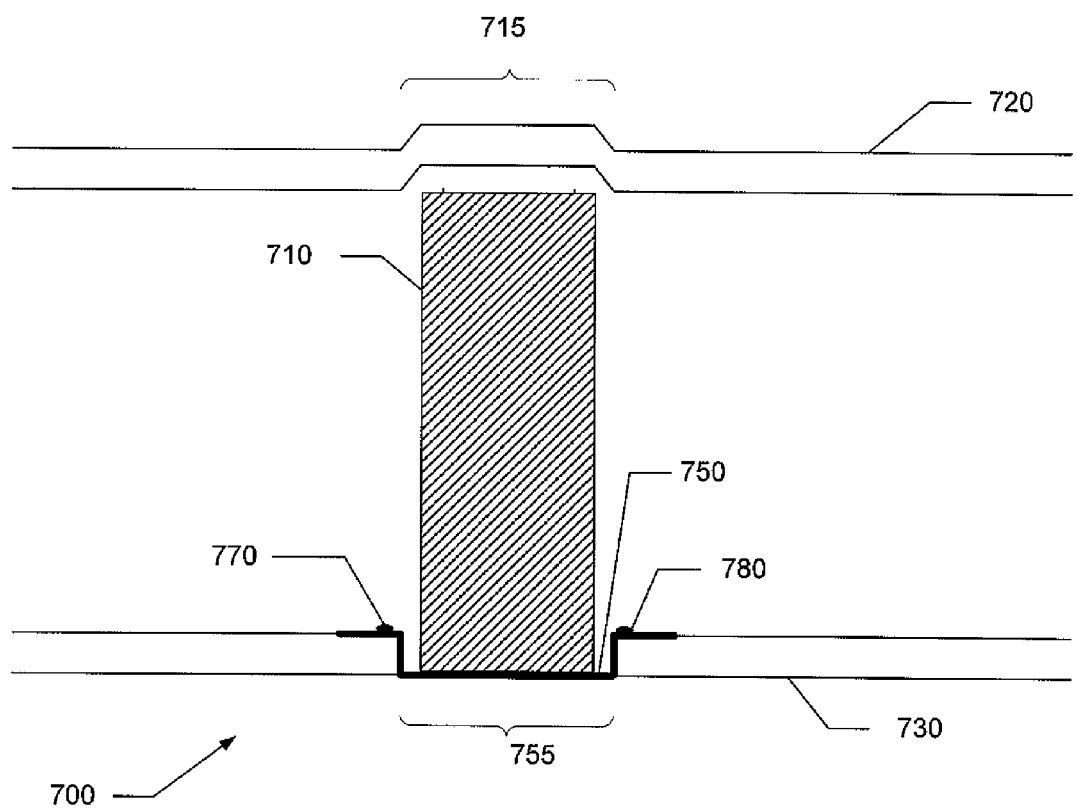
FIG. 7 shows a computer server cooling system in accordance with one or more embodiments of the invention.

FIG. 7 shows an example computer server cooling system (700) in accordance with one or more embodiments of the present invention. More specifically, FIG. 7 shown a fan housed within an exemplar computer server system enclosure in accordance with embodiments of the present invention. Those skilled in the art will appreciate that a fan enclosed by a bracket casing in accordance with embodiments of the present invention may be housed within a computer server system such as that shown in FIG. 7, in which one or more of the computer server system casing enclosures include cut-out sections and/or embossed sections to facilitate the housing of the enclosed fan.

With respect to FIG. 7, the cooling system (700) includes a top enclosure (720) and bottom enclosure (730), which together form a portion of the casing of the computer server system. Those skilled in the art will appreciate that the aforementioned casing may include other components as part of the server system, such as hard disk drives, a motherboard, etc. The top enclosure (720) has an embossed section (715). A fan (not shown) enclosed by a bracket casing (710), as described above, is disposed under the embossment section (715) of the top enclosure (720). Those skilled in the art will appreciate that although the fan itself is not shown in FIG. 7, the fan is contained within the bracket casing represented by reference number (710). The fan may be attached directly to the bottom enclosure (730). The fan may also be side mounted or front/back mounted. In one or more embodiments of the invention, the bottom enclosure (730) has a cut-out section (755), in which a cover (750), having thickness less than that of the bottom enclosure (730), is disposed. The cover (750) is attached to the bottom enclosure by, for example, rivets (770, 780) onto the side portions of the cover (750) that sit on the bottom enclosure (730). The cover (750) may also be attached by screws, adhesives, staking, spot welding, swaging, bonding, or other attachment methods well-known in the art.

Although FIG. 7 shows the cut-out section (755) and the cover (750) on the bottom enclosure (730), those skilled in the art will appreciate that these elements may also be placed on the top enclosure (720). In one or more embodiments of the invention, the cut-out section (755) may be obtained by drilling, punching, cutting, or any other available method known to one skilled in the art. Further, the cover (750) may be sheet metal, metal alloy, polymer, or any other suitable material known in the art.

Embodiments of the invention provide a complete mechanical isolation for cooling fans. The solution provided by embodiments of the invention can be easily integrated into existing system designs, is easy to assemble and manufacture, and provides flexibility in application. The cooling solution of the present invention is also cost-effective and robust. Particularly, the fan module designs for the server systems does not need to be modified to employ embodiments of the present invention. More specifically, embodiments of the invention provide an effective cooling solution for server systems that include height restrictions, such as server systems that include thicker power supply walls, resulting in a height availability for a fan size of 39 mm or less. For example, embodiments of the invention can provide mechanical isolation for any size fans in 1 U server systems, where height constraints exist, without any change in design. Those skilled in the art will appreciate, however, that physical limitations may exist for larger sized fans, such as 40 mm fans, as all the usable height in the server system may be occupied by the fan itself.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. A computer server system having a cooling mechanism, comprising:
 a fan configured to cool the computer server system, wherein the computer server system includes a plurality of components;
 a first casing comprising the plurality of components and the fan; and
 a second casing comprising the fan, wherein the second casing comprises a first bracket and a second bracket that latch together to enclose the fan,
 wherein the second casing enclosing the fan is configured to provide complete isolation of the fan from the first casing and eliminates the transmission of vibrations generated by the fan to the plurality of components.

2. The computer server system of claim 1, wherein the first bracket and the second bracket have identical geometries.

3. The computer server system of claim 1, wherein the second casing is made of an energy absorbing elastomer.

4. The computer server system of claim 3, wherein the energy absorbing elastomer is one selected from the group consisting of natural rubber and synthetic rubber.

5. The computer server system of claim 1, wherein the fan is a 36 mm high revolution per minute (rpm) fan.

6. The computer server system of claim 1, wherein the plurality of components comprises a hard disk drive.

7. The computer server system of claim 1, wherein the first bracket comprises a first latch feature that corresponds with a second latch housing on the second bracket, and a first latch housing that corresponds with a second latch feature on the second bracket.

8. The computer server system of claim 7, wherein at least one of the first latch feature and the second latch feature is triangular.

9. The computer server system of claim 1, wherein the first casing comprising a top enclosure and a bottom enclosure for enclosing the plurality of components, and wherein at least one of the top enclosure and the bottom enclosure have a cut-out section.

10. A computer server cooling system, comprising:
- a first casing comprising a top enclosure and a bottom enclosure, and
- a fan disposed between the top enclosure and the bottom enclosure, wherein
    - the fan is enclosed in a second casing configured to completely isolate the fan from the first casing such that vibration of the fan is prevented from being transferred to the first casing,
    - wherein the second casing comprises a first bracket and a second bracket that latch together to enclose the fan, and
    - wherein the second casing eliminates the transmission of vibrations generated by the fan to a plurality of components in the first casing.

11. The computer server cooling system of claim 10, wherein the second casing is made of an energy absorbing elastomer.

12. The computer server cooling system of claim 10, wherein the first bracket and the second bracket have identical geometries.

13. The computer server cooling system of claim 10, wherein the first bracket comprises a first latch feature that corresponds with a second latch housing on the second bracket, and a first latch housing that corresponds with a second latch feature on the second bracket.

14. The computer server cooling system of claim 10, wherein at least one of the first latch feature and the second latch feature is triangular.

15. The computer server cooling system of claim 10, wherein a cut-out section is located at one of the top enclosure and the bottom enclosure, and an embossed section is located at the other of the top enclosure and the bottom enclosure.

16. The computer server cooling system of claim 10, wherein both the top enclosure and the bottom enclosure have a cut-out section directly over and under the fan, and covers are disposed on the cut-out sections, each covers being of a thickness less than that of a thickness of the top enclosure and the bottom enclosure.

* * * * *